(12) United States Patent
Heineman et al.

(10) Patent No.: US 8,829,990 B2
(45) Date of Patent: Sep. 9, 2014

(54) ATTENUATING NON-LINEAR NOISE IN AN AMPLIFIER WITH ALTERNATING DC-OFFSET CORRECTION

(76) Inventors: Douglas E. Heineman, Lakeway, TX (US); Mark A. Alexander, Austin, TX (US)

(*) Notice: Subject to any disclaimer, the term of this patent is extended or adjusted under 35 U.S.C. 154(b) by 0 days.

(21) Appl. No.: 13/595,141

(22) Filed: Aug. 27, 2012

(65) Prior Publication Data

US 2013/0088294 A1    Apr. 11, 2013

Related U.S. Application Data

(60) Provisional application No. 61/543,998, filed on Oct. 6, 2011.

(51) Int. Cl.
*H03F 3/38* (2006.01)
*H03F 3/217* (2006.01)
*H03F 3/189* (2006.01)
*H03F 1/26* (2006.01)
*H03K 5/003* (2006.01)

(52) U.S. Cl.
CPC .............. *H03K 5/003* (2013.01); *H03F 3/2173* (2013.01); *H03F 3/189* (2013.01); *H03F 1/26* (2013.01)
USPC ............................................ 330/10; 330/251

(58) Field of Classification Search
CPC ........... H03F 3/38; H03F 3/387; H03F 3/393; H03F 3/217; H03F 3/2171; H03F 3/2173
USPC ........................................ 330/10, 207 A, 251
See application file for complete search history.

(56) References Cited

U.S. PATENT DOCUMENTS 7,378,903 B2 * 5/2008 Bates ................................ 330/9

* cited by examiner

*Primary Examiner* — Steven J Mottola
(74) *Attorney, Agent, or Firm* — Meyertons Hood Kivlin Kowert & Goetzel, P.C.; Jeffrey C. Hood

(57) ABSTRACT

An amplifier may include two or more pulse-width modulators controlling respective sets of switches to produce an amplified version of a source signal. A positive DC-offset based on the source signal may be applied to the pulse-width modulator controlling one respective set of switches, and an equal value negative DC-offset may be applied to the pulse-width modulator controlling the other respective set of switches, to provide an effective offset between the respective points in time of the rising/falling edges of the different pulse-width modulated control signals. The addition of alternating positive and negative DC-offset values doesn't affect the output load, and doesn't degrade the signal. The DC-offsets may be added at a frequency selected to be beyond the signal baseband, and the value of the small input signal level may be determined using an RMS level comparator or similar measurement technique.

31 Claims, 12 Drawing Sheets

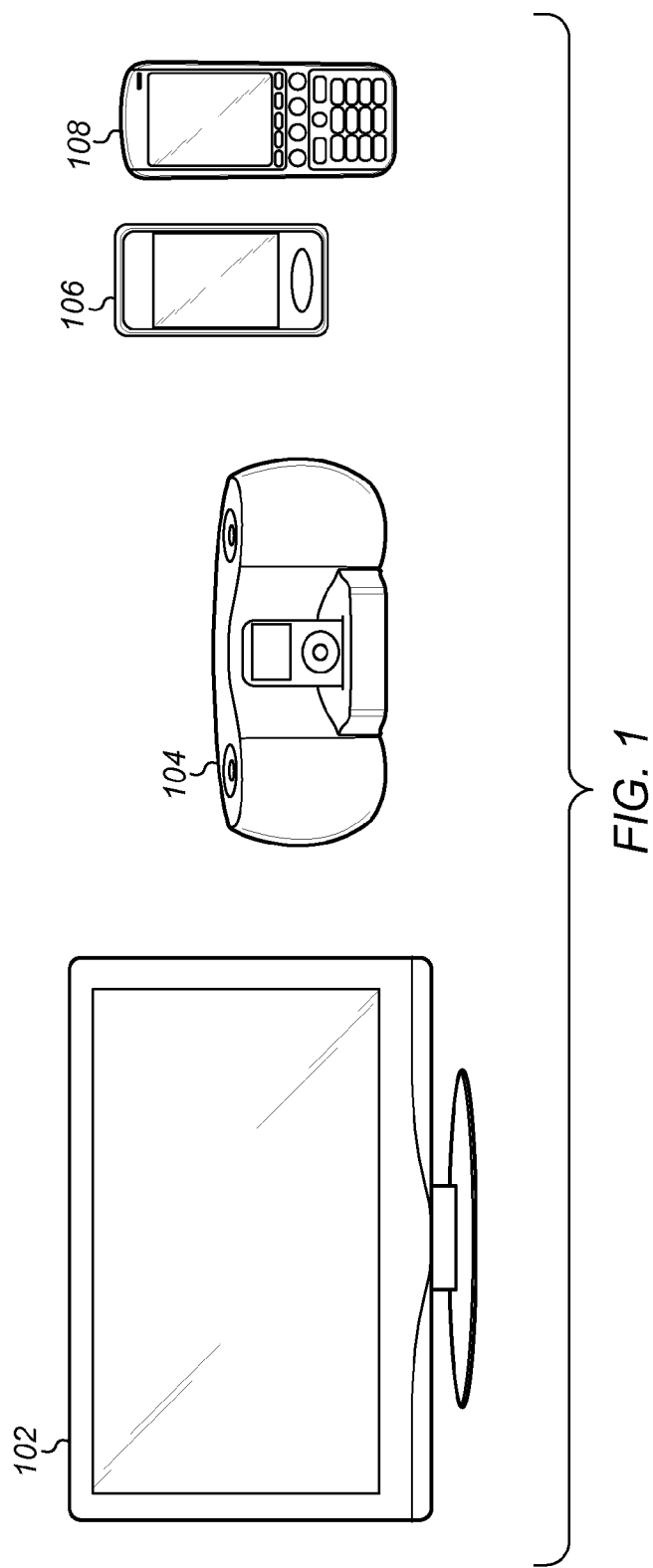

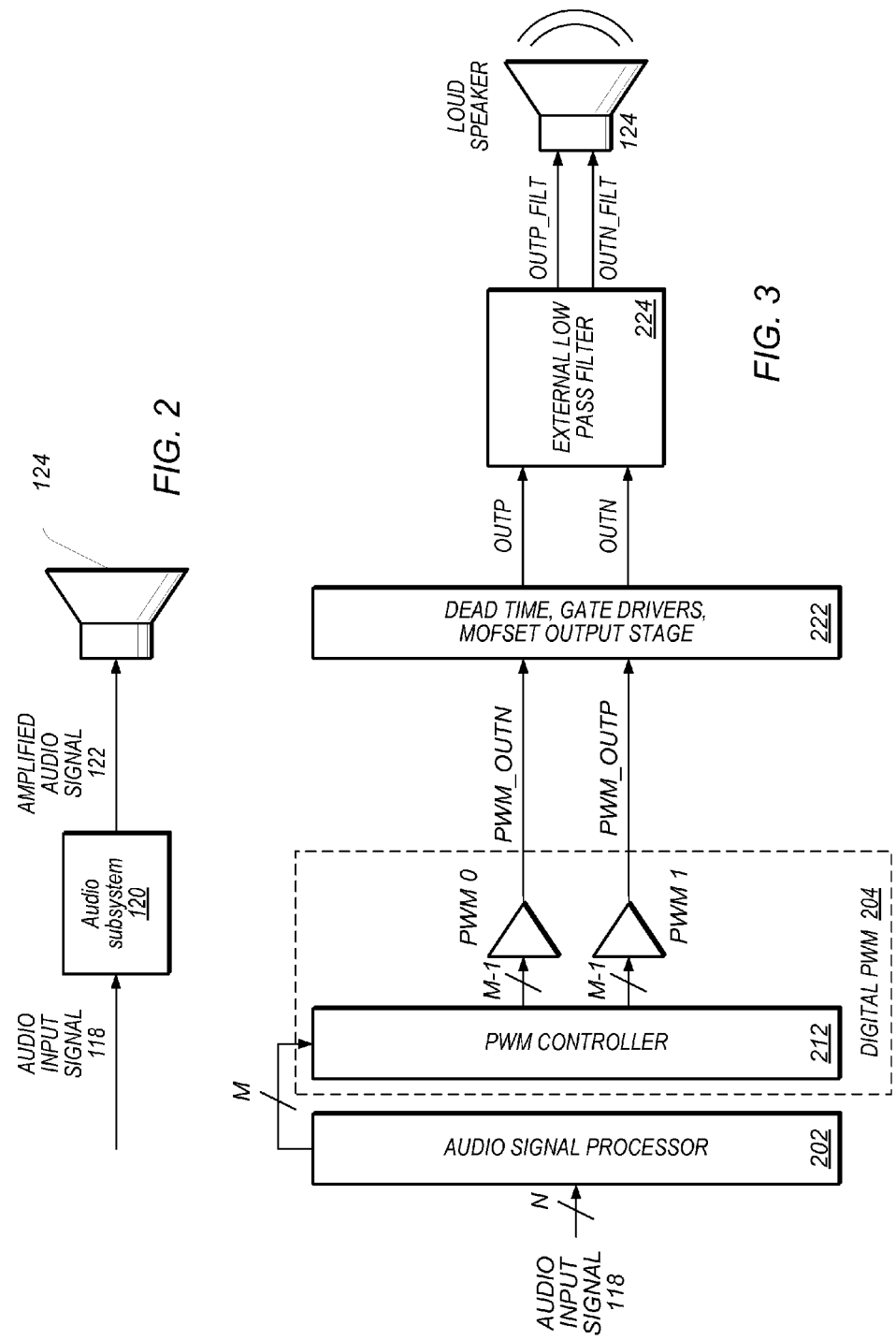

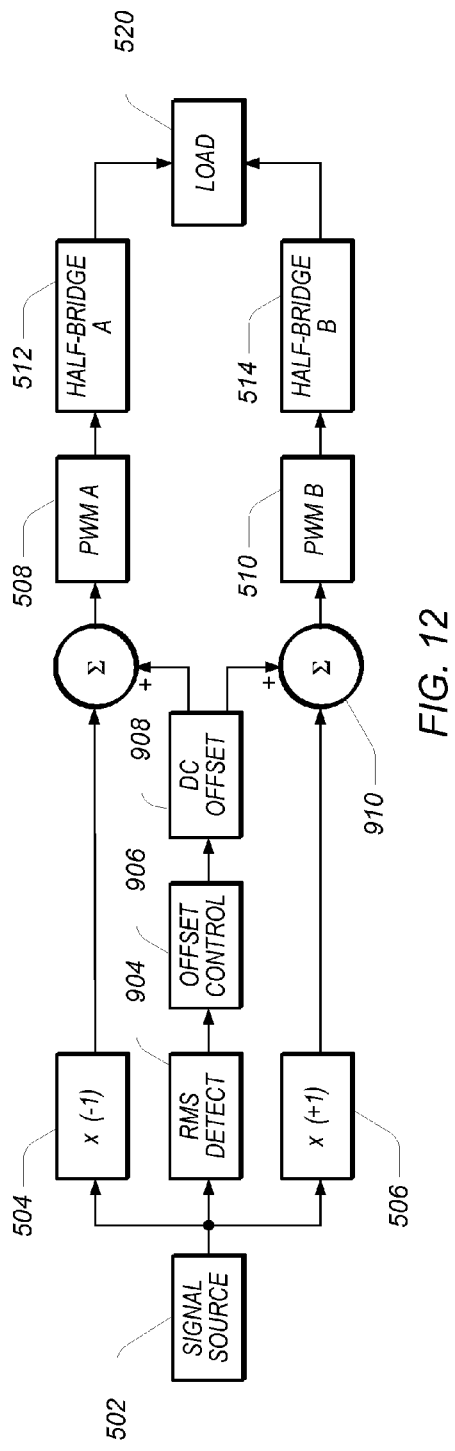
FIG. 12
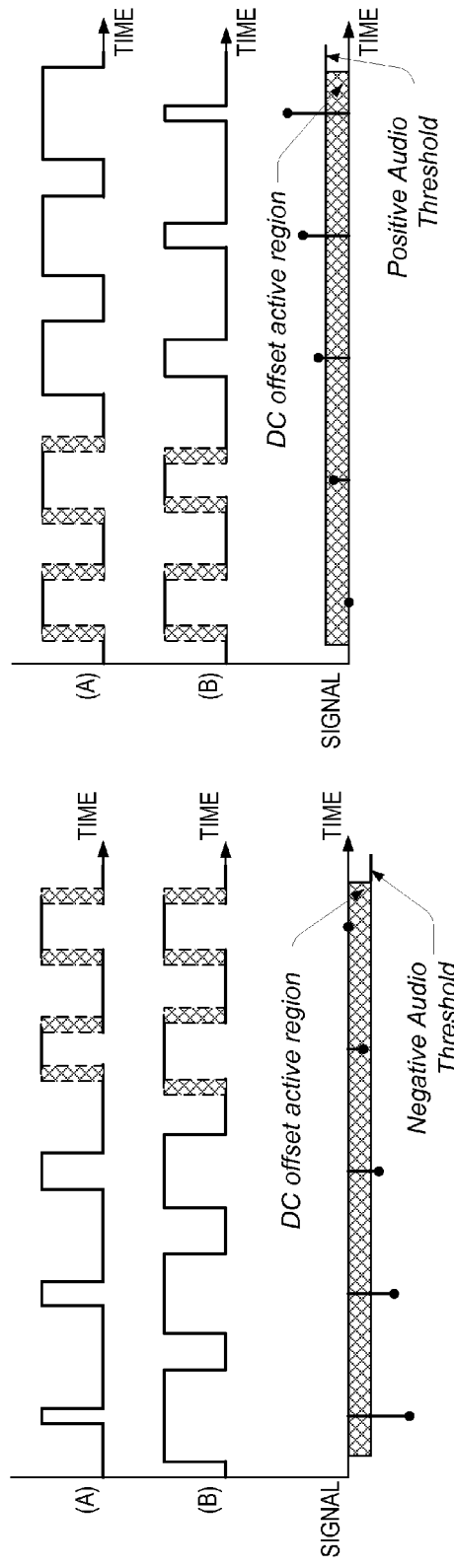
FIG. 13
FIG. 14

ATTENUATING NON-LINEAR NOISE IN AN AMPLIFIER WITH ALTERNATING DC-OFFSET CORRECTION

PRIORITY CLAIM

This application claims benefit of priority of U.S. provisional application Ser. No. 61/543,998 titled "Circuits and Methods Used in Audio Signal Processing", filed Oct. 6, 2011, which is hereby incorporated by reference in its entirety as though fully and completely set forth herein.

FIELD OF THE INVENTION

The present invention relates generally to signal processing, and more particularly to attenuating non-linear noise in an amplifier.

DESCRIPTION OF THE RELATED ART

Signal processing represents a combined application of electrical/computer engineering and mathematical principles, primarily directed to the analysis of and operation on either discrete or continuous time signals. Signals of interest can include sound, images, time-varying measurement values and sensor data, for example biological data such as electrocardiograms, control system signals, telecommunication transmission signals such as radio signals, and many others. Signals are typically analog and/or digital electrical representations of time-varying or spatial-varying physical quantities. Types of signal processing include analog, discrete time, and digital.

Analog signal processing is performed on signals that have not been digitized, for example signals that are used in classical radio, telephone, radar, and television systems. Analog signal processing typically makes use of linear electronic circuits such as passive filters, active filters, additive mixers, integrators and various types of delay lines, as well as non-linear circuits such as frequency mixers and voltage-controlled amplifiers, voltage-controlled filters, voltage-controlled oscillators and phase-locked loops. Discrete time signal processing is performed on sampled signals that are defined at discrete points in time, and as such are quantized in time, but not in magnitude. Analog discrete-time signal processing is based on electronic devices such as sample and hold circuits, analog time-division multiplexers, analog delay lines and analog feedback shift registers, and may be considered a predecessor of digital signal processing.

Digital signal processing involves the processing of digitized discrete-time sampled signals. Processing is typically performed by general-purpose computers or digital circuits such as application specific integrated circuits (ASICs), field-programmable gate arrays, or specialized digital signal processors (DSPs). Digital signal processing mostly includes performing arithmetic operations such as fixed-point and floating-point operations, real-valued and complex-valued operations, multiplication and addition. Many of these operations are implemented through the use of circular buffers and look-up tables. Examples of digital signal processing algorithms include Fast Fourier transforms (FFT), finite impulse response (FIR) filters, infinite impulse response (IIR) filters, and adaptive filters such as the Wiener and Kalman filters.

Audio signal processing, sometimes referred to as audio processing, is the processing of electrical signals that correspond to auditory signals, or sound. Since audio signals may be electronically represented in either digital or analog format, audio signal processing may also take place in either the analog or digital domain. In analog audio signal processing, operations are performed directly on the electrical signals corresponding to the audio signals, while digital signal processing consists mostly of mathematical operations performed on digital representations of the electrical signals that correspond to respective audio signals. Typically, the digital representation of audio signals expresses the pressure waveform that characterizes the audio signal as a sequence of binary numbers. This permits signal processing using digital circuits such as microprocessors and computers, and while analog to digital conversion can be prone to loss, most modern audio systems use the digital approach because digital signal processing techniques are overall more powerful and efficient than signal processing in the analog domain.

Overall, since audio signals first need to be converted to electrical signals, digital audio processing systems include both analog and digital components in a full processing path that begins with the pressure waveforms that physically define the audio signal and ends with the digital representation of the corresponding electrical signals derived therefrom. Some of the most common components typically used in audio processing systems include pulse-width modulators, power limiters, start-up circuits, power regulators, comparators, amplifiers, oscillators, among others. The quality and operating precision of these components directly impacts the quality of audio signal processing systems, as designers have to continually overcome numerous difficult design challenges to meet required specifications and quality standards.

SUMMARY OF THE INVENTION

The output of an amplifier, for example an open-loop amplifier or a closed-loop amplifier, may be configured in either single-ended or differential mode, where the differential mode may be a bridge-tied load (BTL) mode. An amplifier having an output configured in single-ended mode may electrically drive a half-bridge circuit in which a set of two switches, that is, a high-side switch and a low-side switch are used in a push-pull (totem-pole) configuration. An amplifier having an output configured in differential mode (i.e. having differential outputs) may electrically drive an output power stage in a full-bridge configuration in which two half-bridge circuits are connected to form an effective full-bridge circuit. In one set of embodiments, a differential output amplifier may be constructed as an all-digital class-BD amplifier that may include two or more pulse-width modulators (PWMs) controlling the respective sets of switches in the full-bridge output circuit to produce an amplified output (or amplified version) of a small (audio) input signal.

The electrical disturbance created in a full-bridge circuit and its peripheral support circuitry (such as the gate drive circuit) when all the high-side switches turn on within a short period of time with respect to each other may result in distortion of the waveform at the output of the amplifier, particularly for low level signals. This is known as "crossover distortion" and occurs as a result of electrical interference or "cross-coupling" from one half-bridge to the other, during near simultaneous switching of both half-bridges in a pulse-width-modulated (PWM) class-BD output stage. It is most severe when the differential output of the amplifier is close to zero, and the switching edges of each half bridge are nearly aligned in time. The interference coupling mechanism is a bidirectional phenomenon and is typically the result of, but not limited to switching disturbances or transient voltage fluctuations impressed upon a common power supply rail that feeds current to both half bridges in a class-BD amplifier output stage. Additionally, an increase in the electrical noise floor of a class-BD amplifier, known as "zero-crossing noise", is also observed as a result of this interference mechanism. The increase in noise that is thus created in the vicinity of a zero differential output may be considered the result of a multiplicative non linearity that occurs due to modulation of the power supply rail with a signal dependent component, i.e. a component that is switching-edge position dependent, and hence dependent on the signal itself. Such nonlinearity may cause out-of-band noise components at certain frequencies, which are separated by a bounded difference equal to or less than the signal bandwidth of the amplifier, to intermodulate with each other.

The process, from a spectral perspective, results in demodulated noise difference components that then fall into the pass band of the amplifier. This "noise intermodulation" phenomenon may result in a large and easily measurable increase in amplifier noise floor, which is highly undesirable. A mechanism such as the one described above may also result in an even more exaggerated noise floor, when the spectrum of out-of-band noise present at the class-BD power stage input is non-flat, and rising with frequency. This type of non-flat high-frequency noise spectrum is typically produced when a PWM stage is driven by a high-order noise-shaper, which also embodies a high-pass noise-transfer-function (NTF). The noise-shaper tends to accentuate high frequency quantization noise, which normally occurs as an integral part of the process of word length reduction within the PWM pre-processing circuitry.

The use of "noise shaping" is very common in digital class-D amplifiers, and the increase in high frequency out-of-band noise is not normally a problem since it is removed by the output "reconstruction filter" prior to the signal reaching the load. The filter is typically required to employ a "low-pass" transfer function, with a cut-off frequency just above the pass band of the amplifier. As previously described, this nonlinear "cross-coupling" effect is greatly exacerbated when both half-bridges in a class-BD amplifier exhibit near simultaneous switching. The electrical disturbance coupling mechanism may be partially mitigated, but not completely eliminated, by reducing the power supply bus impedance at the PWM carrier rate (typically by adding additional power supply decoupling capacitance).

Adding power supply decoupling capacitance is usually insufficient, however, to attenuate the power supply coupling phenomenon, and hence resultant nonlinearity, to an acceptably low level. Therefore, an additional means of suppressing this power supply coupling mechanism is highly desirable, if an amplifier with both a low electrical noise floor and minimal crossover distortion is to be realized. From an end user perspective, the qualitative performance of the amplifier suffers significant degradation when the PWM outputs of the amplifier attempt to simultaneously turn on the high side switches. Therefore, it is desirable to create a pre-determined and repeatable timing offset between the signals controlling the high-side switches, to prevent simultaneous or near simultaneous edge alignments in a class-BD output stage. It is also important to ensure that this timing offset results in a net time-averaged signal that has zero differential value, such that any DC or low frequency components at the output of a class-BD amplifier are suppressed. It is furthermore desirable that the introduction of the timing offset does not in any way introduce spurious signals within the pass band of the amplifier, which could corrupt the overall signal reproduction characteristics or "fidelity" of said amplifier.

Accordingly, in one set of embodiments, non-linear noise affecting the amplifier may be attenuated by alternately applying a positive DC-offset—derived from the input (or source) signal—to the PWM driver(s) controlling one respective set of the switches, while applying an equal value but opposite (i.e. negative) polarity DC-offset—also derived from the source signal—to the PWM driver(s) controlling the other respective set of switches. The alternating addition of the positive and negative DC-offsets results in an effective offset between the timing of the rising edges of the respective PWM signals output by the PWM drivers, and an effective offset between the timing of the falling edges of the respective PWM signals output by the PWM drivers.

The alternating addition of the positive and negative DC-offsets does not introduce a DC component at the output load, and it does not degrade the output signal while mitigating potential noise in the switches. The positive and negative (or the opposite polarity) DC-offsets may be added at a frequency that is outside the baseband frequency bandwidth of the input (source) signal, and may therefore not adversely affect the amplified output signal. The absolute value of the input signal, whether the small input signal or the large input signal, may be averaged through the use of an RMS (root mean square) level comparator, or other comparable level-measurement technique(s), to derive the DC-offset value for the positive and negative DC-offsets. In one set of embodiments, the level comparator is fully programmable, and includes a hysteresis feature, in which timeouts associated with the rate of both the addition and the release of the DC-offset to the PWM audio output may also be fully programmable. For small input signals, the total DC-offset may be added and subtracted to/from the (control) signals input into the PWM drivers over a timeout period of programmable specified length to ensure that no additional noise is introduced into the amplified output signal. Conversely, for input signals that are not small, the total DC-offset added and subtracted to/from the control signals input into the PWM drivers may be decreased over a timeout period of programmable specified length to ensure that no noise is introduced into the amplified output signal. The maximum DC-offset may also be programmable, and in some embodiments autonomously detected from either previous audio signal levels or systems having deterministic audio signal levels.

In one set of embodiments, a method for attenuating non-linear noise in an amplifier includes deriving a first representative signal and a second representative signal from a source signal, which may be an audio input signal. The method further includes obtaining a first intermediate signal and a second intermediate signal. The first intermediate signal is obtained by deriving a positive DC-offset from the source signal, and adding the positive DC-offset to the first representative signal. The second intermediate signal is obtained by deriving a negative DC-offset from the source signal, and adding the negative DC-offset to the second representative signal, with the negative DC-offset and the positive DC-offset having the same absolute value. Subsequently, a first control signal is derived from the first intermediate signal, and a second control signal is derived from the second intermediate signal, and the amplified version of the source signal is obtained by controlling a first set of switches with the first control signal, and a second set of switches with the second control signal. The addition of positive and negative DC-offsets is alternated evenly between the first and second representative signal at a specified frequency.

The first control signal and the second control signal may both be PWM signals, while the first and second sets of switches may be constructed from complementary metal-oxide semiconductor (CMOS) devices. The positive DC-offset and negative DC-offset may be determined based on the value of the source signal, for example based on the absolute value of the source signal, which may include performing root mean square level comparison/detection. The absolute value of the negative and positive DC-offset may also be adjusted over a timeout period of specified length to ensure that no noise is introduced in the amplified version of the source signal. The adjustment may include increasing the absolute value of the negative and positive DC-offset when a value of the source signal is small, and decreasing the absolute value of the negative and positive DC-offset when a value of the source signal is large.

In one embodiment, an amplifier includes an input interface to receive a source signal, a first set of control switches and a second set of control switches to produce an amplified version of the source signal, a preprocessor to generate a first representative signal and a second representative signal based on the source signal, and offset circuitry to generate a DC-offset value based on the source signal, produce a first control input signal from the DC-offset value and the first representative signal, and produce a second control input signal from the DC-offset value and the second representative signal. The amplifier also includes driver circuitry to generate a first driver signal based on the first control input signal, and a second driver signal based on the second control input signal, to control the first set of control switches with the first driver signal, and control the second set of switches with the second driver signal in order to generate the amplified version of the source signal.

In some embodiments, the driver circuitry is PWM circuitry, and the first driver signal and the second driver signal are both PWM signals. The input interface may be an I²S interface, and the preprocessor may include a delta-sigma modulator for converting the source signal, and may also include a noise shaper for generating the first representative signal and the second representative signal from the converted source signal. In a preferred embodiment, the offset circuitry alternates between adding the DC-offset value to the first representative signal while subtracting the DC-offset value from the second representative signal, and subtracting the DC-offset value from the first representative signal while adding the DC-offset value to the second representative signal to ensure an absolute time delay between the edges of the two signals. A frequency adjustment circuitry within the offset circuitry may be used to control a frequency at which the offset circuit alternates between adding and subtracting the DC-offset value from the respective representative signals, with the frequency specified to be beyond (i.e. fall outside) the baseband of the source signal. This alternating arithmetic operation ensures that no undesired voltage is detected at the output. The frequency may also be randomized, that is, the value of the frequency may be randomly selected from a number of available frequencies to obtain an effect very similar to a spread spectrum.

The offset circuitry may increase the DC-offset value over a time period of specified length when a value of the source signal is less than a programmable specified threshold value, and decrease the DC-offset value over a time period of specified length when a value of the source signal is greater than or equal to the programmable specified threshold value. In addition, the offset circuitry may cease increasing the DC-offset value when it reaches a programmable specified maximum value, and also cease decreasing the DC-offset value when it reaches a programmable specified minimum value.

In various embodiments, an amplifier includes three processing elements and first and second sets of switches for producing an amplified signal. The first processing element is used for deriving a first representative signal and a second representative signal from a source signal, which may be an audio input signal. The second processing element is used for deriving a DC-offset value from the source signal, obtaining a first intermediate signal from the first representative signal by adjusting the first representative signal by the DC-offset value, and obtaining a second intermediate signal from the second representative signal by adjusting the second representative signal by the DC-offset value. The third processing element is used for deriving a first control signal from the first intermediate signal, and a second control signal from the second intermediate signal, and effecting the amplified version of the source signal by controlling the first set of switches with the first control signal, and controlling the second set of switches with the second control signal.

In one embodiment, the third processing circuit is a pulse-width modulator, and the first control signal and the second control signal are PWM signals. For optimum performance, the second processing element is operated to obtain the first intermediate signal by alternately adding or subtracting the DC-offset value to/from the first representative signal, and may also be similarly operated to obtain the second intermediate signal by alternately adding the DC-offset value to the second representative signal when subtracting the DC-offset value from the first representative signal, and subtracting the DC-offset from the second representative signal when adding the DC-offset value to the first representative signal. In addition, the second processing element may feature an adjustment circuit for controlling a frequency with which the second processing element alternates between adding and subtracting the DC-offset value to/from the first representative signal and the second representative signal, with the frequency specified to be outside the baseband frequency bandwidth of the source signal.

The second processing element may adjust the DC-offset value according to a value of the source signal, which may include increasing the DC-offset value when the value of the source signal exceeds a programmable enable threshold value, until the DC-offset value reaches a programmable maximum offset value. The adjustment may also include decreasing the DC-offset value when the value of the source signal does not exceed the programmable enable threshold value, until the DC-offset value reaches a programmable minimum offset value. Finally, the DC-offset value may be cleared when the value of the source signal either reaches or exceeds a programmable offset disable threshold value.

BRIEF DESCRIPTION OF THE DRAWINGS

A better understanding of embodiments of the present invention may be obtained when the following Detailed Description is considered in conjunction with the following drawings, in which:

FIG. 1 illustrates various exemplary systems or devices which may use the techniques described herein;

FIG. 2 is a block diagram of a portion of a system including a multi-channel audio subsystem that may be operated according to various embodiments;

FIG. 3 is an exemplary block diagram of an audio subsystem which may be operated according to various embodiments;

FIG. 12 shows a modified and expanded version of the control diagram from FIG. 5, highlighting how a DC-Offset may be added to both PWM signals to prevent the rising and falling edges of the PWM A and PWM B signals from lining up with respect to each other;

FIG. 13 shows waveforms corresponding to the control diagram of FIG. 12 for the input signal and the outputs PWM A and PWM B, as a negative input signal passes through the DC offset active region between the negative Audio Threshold and the zero crossover point;

FIG. 14 shows waveforms corresponding to the control diagram of FIG. 12 for the input signal and the outputs PWM A and PWM B, as a positive input signal passes through the DC offset active region between the zero crossover point and the positive Audio Threshold;

Figure 4:
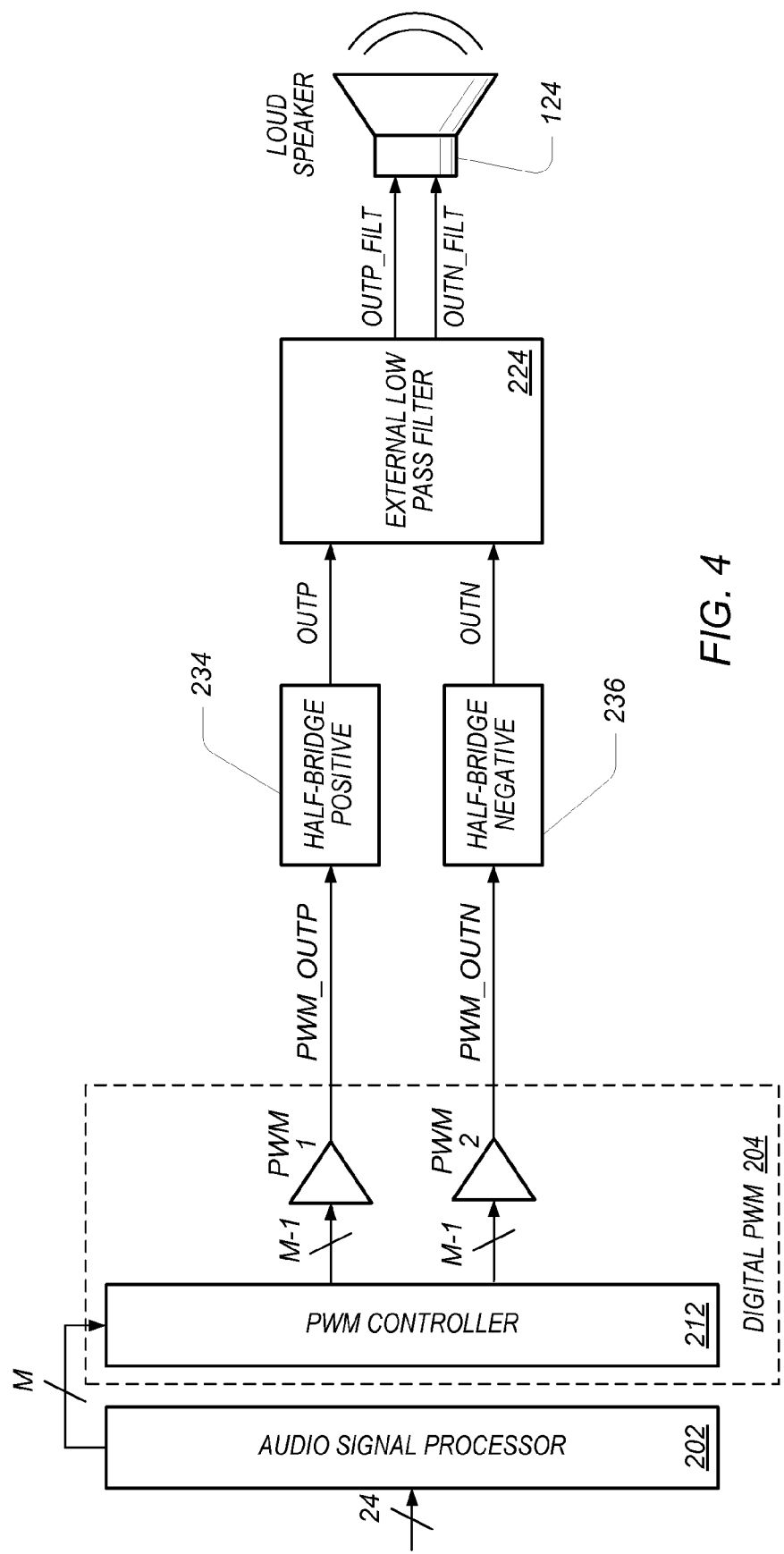
FIG. 4 shows the partial block diagram of an audio system which may use the techniques described herein, highlighting the role of pulse-width modulation (PWM) in the audio system.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

FIG. 1 illustrates exemplary systems, which may utilize the techniques described above. More specifically, FIG. 1 illustrates exemplary systems, which may utilize an audio subsystem, (which may include an amplifier such as a Class D amplifier), featuring various improvements. As shown, embodiments of the techniques disclosed herein may be used in any one ore more of various systems which involve the amplification of signals. For example, embodiments of the invention may be used in various systems that operate to amplify audio signals for provision to a loudspeaker for audible presentation. As shown, the exemplary systems may include a display device 102; an audio system 104, such as a stereo amplified docking station for a portable music player, CD player, etc.; or a telephone 106 and 108, such as a smart phone, e.g., an iPHONE™ or other similar type of smart phone. It should be noted that FIG. 1 is provided by way of example, and is by no means intended to be exhaustive. Accordingly, various embodiments disclosed herein may equally be used in other applications and systems not shown in FIG. 1, where limiting the output power is desired. It is also noted that the various terms or designations for circuits, such as "offset", "driver", etc. are merely names or identifiers used to distinguish among these circuits, and these terms are not intended to connote any specific meaning.

FIG. 2 illustrates an example of an Audio subsystem 120 which may be present in the systems of FIG. 1. In one set of embodiments, audio subsystem may be an amplifier subsystem, which may more specifically be a class D amplifier subsystem. In one or more of the devices of FIG. 1, at least one Audio subsystem 120 may be present in the audio output section of the device, and more specifically in the amplifier portion of the audio section of the device. As shown in FIG. 2, an audio input signal 118 may be received at an input to the Audio subsystem 120. The Audio subsystem 120 receives the audio input signal 118 and operates to amplify the received audio input signal to produce amplified audio output signal 122. The amplified audio output signal 122 may then be provided to loudspeaker 124 for audible presentation.

FIG. 3 is an exemplary block diagram of an audio subsystem (which, in some embodiments, may be one implementation of a Class D amplifier), according to prior art. As shown in FIG. 3, the audio subsystem comprises an input that receives digital audio data, which is an N-bit pulse code modulated (PCM) input signal. The audio subsystem also includes a digital signal processor, referred to as Audio Signal Processor ASP 202, which receives the input signal and generates output data that is configured for use in generating a pulse train driver signal that corresponds to the input signal. The ASP 202 receives the N-bit input signal, and generates an M-bit output, which is provided to a Digital PWM (Pulse Width Modulator) block 204.

The Digital PWM block 204 includes a PWM Controller 212, two PWM driver blocks labeled PWM0 (232) and PWM1 (234), and may contain other logic as well. The PWM Controller 212 calculates edge locations of the pulse train to be generated, and produces two (M-1)-bit outputs. In particular, each of the two (M-1)-bit outputs may represent respective edges of pulses to be generated. The two (M-1)-bit outputs are used by individual pulse width modulators PWM0 and PWM1 to produce the final differential PWM outputs PWM_OUTP and PWM_OUTN. In general, PWM block 204 may comprise a small signal-processing block that operates on the M-bit input data and separates the M-bit input data into two individual streams of M-1 bits each. These (M-1)-bit streams may be independent, or, more specifically, they may have some correlation to each other, while the actual data may differ on an instantaneous pulse-by-pulse basis.

Block 222 comprises logic for handling dead time, as well as a MOSFET Power Output Stage and gate drivers for controlling the MOSFET Power Output Stage. The MOSFET Power Output Stage portion of block 222 may include high power switches, preferably MOSFETs (Metal Oxide Semiconductor Field Effect Transistors). The high power switches generate a high-power (amplified) replica of the received pulse train. The MOSFET Power Output Stage portion provides the amplified pulse train to low pass filter 224. As shown, the Output Stage provides a differential pair of output signals, referred to as OUTP and OUTN, which provide two differential pulses per PWM period. The low pass filter 224 performs a low pass filter operation on the differential pulses and provides the two outputs, referred to as OUTP_FILT and OUTN_FILT, to a load, e.g., to a loudspeaker 124.

Attenuating Non-Linear Noise in an Amplifier with Alternating DC Offset Correction FIG. 4 shows the partial block diagram of an audio system highlighting the role of the PWM in generating the output. The number of bits for audio signal processor 202 and PWM controller 212 are shown for illustrative purposes only, and alternate embodiments may include different numbers of bits. As shown in the audio subsystem in FIG. 4, a class-D type amplifier (one possible implementation of which is also shown in FIG. 3) is configured as a class-BD amplifier, where an audio signal is pulse-width modified into two signals, a positive representation PWM_OUTP and a negative representation PWM_OUTN, which are used to drive two half-bridge FET circuits 234 and 236. The two half-bridge circuits, half-bridge positive 234 and half-bridge negative 236 may be connected to form an effective full-bridge circuit to the load where the half-bridge circuits use a set of switches in a totem pole (make-and-break) configuration.

Figure 5:
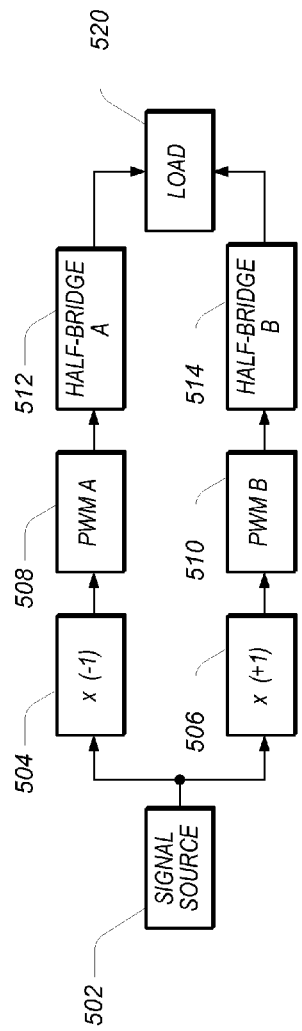
FIG. 5 shows a control diagram representing the overall operating principle of the subsystem of FIG. 4 when operated according to prior art.
Figure 6:
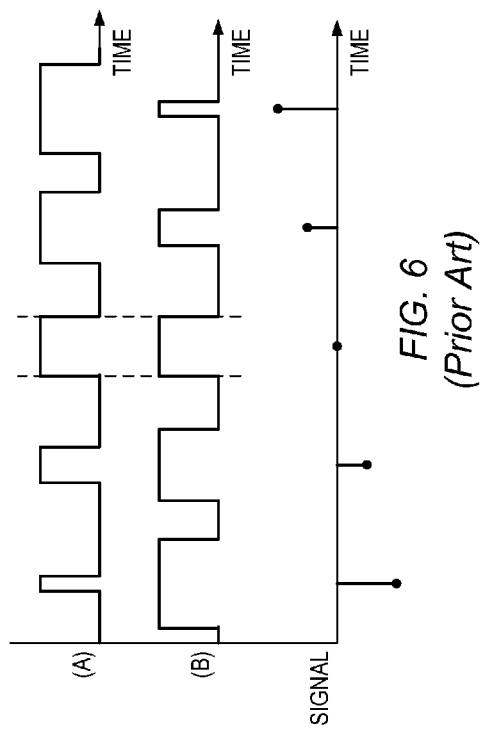
FIG. 6 shows a timing diagram for the input signal from the signal source of FIG. 5, and the resulting signal outputs from the respective half-bridge circuits of FIG. 5.

A control diagram representing the overall operating principle of the subsystem of FIG. 4 when operated according to prior art, is shown in FIG. 5. An audio signal from signal source 502 is modified into two signals through modifiers 504 and 506 into a non-inverted representation PWM B 510 and an inverted representation PWM A 508, respectively. PWM A and PWM B are provided to half-bridge A 512 and half-bridge B 514, respectively, with half-bridge A 512 and half-bridge B 514 coupled to load 520. FIG. 6 shows a signal timing diagram for the input signal from signal source 502 (SIGNAL), and the resulting signal outputs from half-bridge A 512 (A) and from half-bridge B 514 (B). As seen in FIG. 6, at the zero signal source level, the respective rising and falling edges of the PWM signals from half-bridge A and half-bridge B are aligned with respect to each other. The potential adverse effects of this edge alignment are discussed in further detail below.

The PWM drivers (e.g. PWM A 508 and PWM B 510) increase unwanted noise when driving near zero-crossing signal levels and low signal levels (mute and near digital silence) simultaneously into both half-bridge circuits 512 and 514, which causes crosstalk between half-bridge circuits 512 and 514, and adversely affects the output at load 520, thereby negatively impacting the performance of the amplifier. The issue of noise coupling near low signal levels can be caused by non-linearities in the power stage, where a power stage is a set of circuits partially composed of pre-drivers, gate drivers and the half-bridge circuits. The audio signal processor 202, PWM controller 212, and PWM circuits from FIG. 4 may also be represented as shown in the system block diagram of FIG. 7, where the audio input signal is detected at I²S interface 702, goes through digital audio processor and interpolator 704, and processed in PWM preprocessor 706 prior to being converted into pulse-width modulated signals PWM_OUTP and PWM_OUTN through PWM drivers 710 and 712, respectively.

Figure 7:
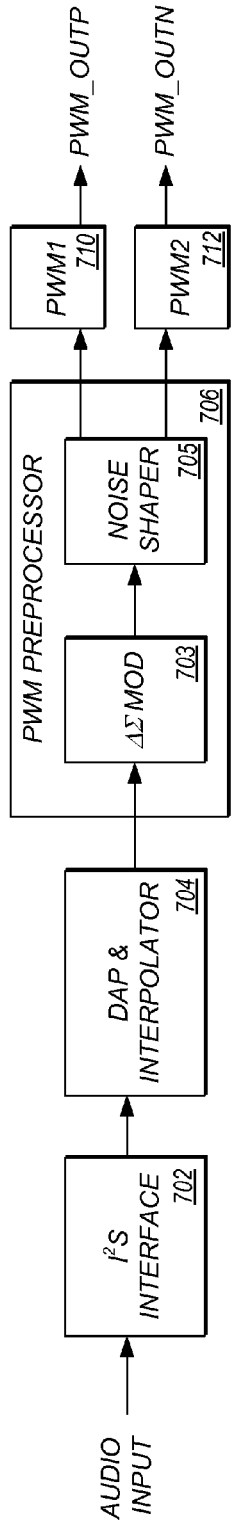
FIG. 7 shows a more detailed partial block diagram of one prior art implementation of the audio signal processor, PWM controller and PWM circuits of FIG. 4.
Figure 8:
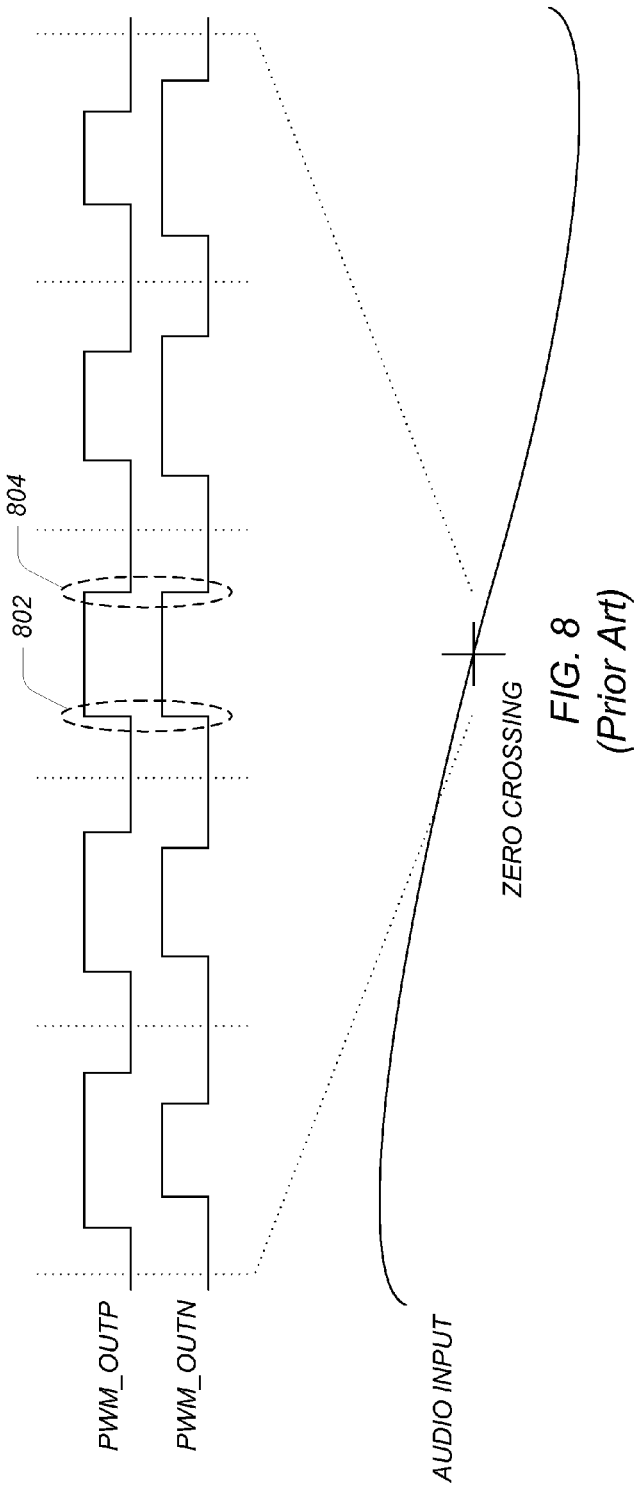
FIG. 8 shows a waveform diagram illustrating the PWM signals PWM_OUTP and PWM_OUTN, and the audio signal near the zero crossing, for the implementation of FIG. 7.

In the embodiment shown in FIG. 7, PWM preprocessor 706 includes a delta-sigma modulator 703 and noise shaper 705 used to provide respective digital signals based on the original audio signal to PWM drivers 710 and 712. FIG. 8 shows a waveform diagram illustrating the PWM signals PWM_OUTP and PWM_OUTN, and the original audio input signal near the zero crossing. As shown in FIG. 8 (and similar to FIG. 6), the audio input signal of a bipolar representation (positive and negative amplitude) nears a point where the audio signal crosses zero. At this cross-section, the edges of the PWM signals PWM_OUTP and PWM_OUTN are near coincident, as also shown in FIG. 8 with rising edges 802 and falling edges 804 of the PWM_OUTP and PWM_OUTN signals, respectively. This close proximity of simultaneous rising edges on the PWM_OUTP and PWM_OUTN signals may cause corruption within the power stage with respect to the absolute timing of the lagging edge relative to the leading edge. This corruption occurs as the power stage exhibits the greatest amount of noise when the HS FET is turned on. If the lagging PWM signal is presently provided to the gate drive circuitry, its level may be corrupted by the noise from turning on the HS FET of the leading PWM signal.

Figure 9:
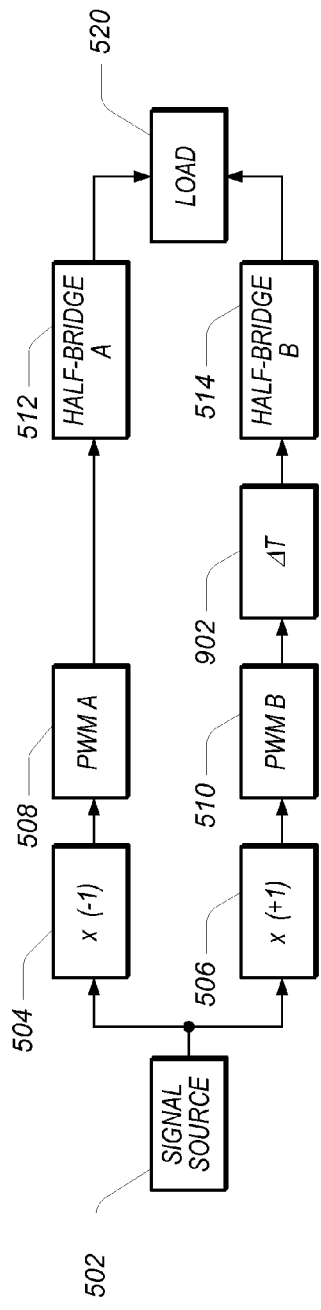
FIG. 9 shows a modified version of the control diagram from FIG. 5, with a delay added in the path of the PWM B driver to create an offset in time between PWM B and PWM A, according to prior art.
Figure 11:
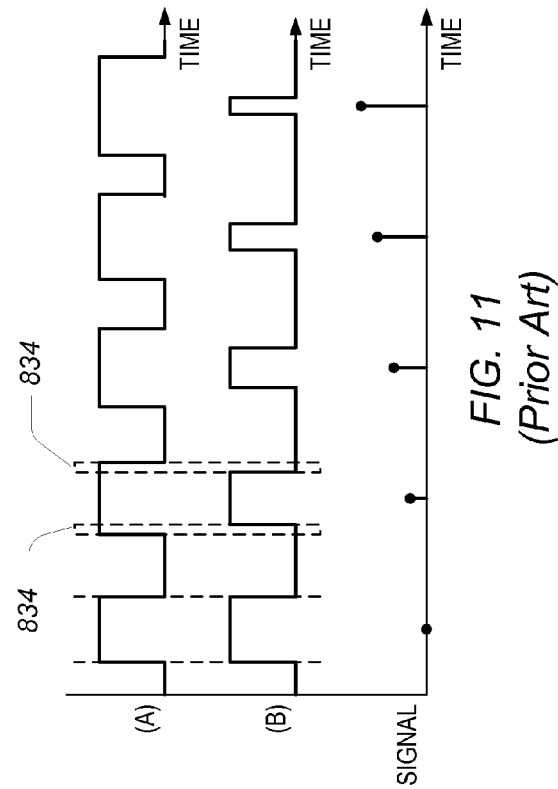
FIG. 11 shows waveforms corresponding to the control diagram of FIG. 9 for the input signal and the outputs PWM A and PWM B when the input signal passes the zero crossover point and has a positive value.
Figure 10:
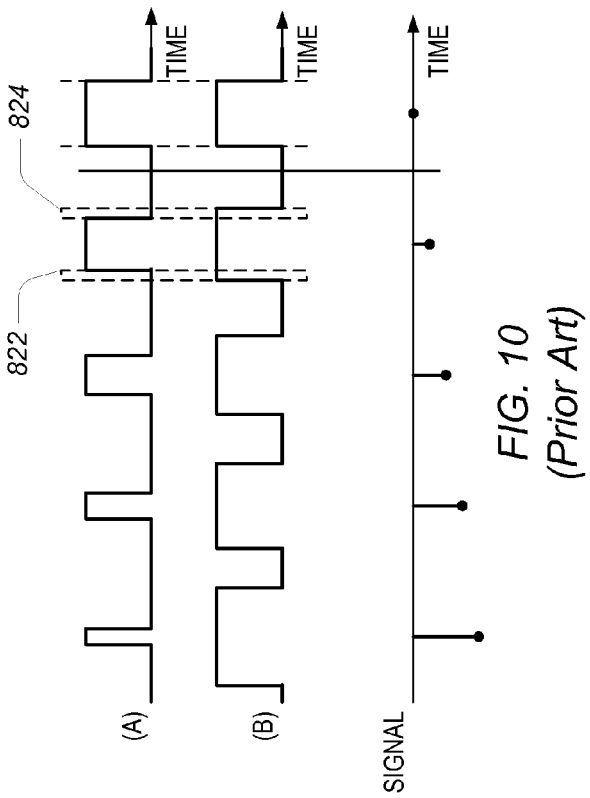
FIG. 10 shows waveforms corresponding to the control diagram of FIG. 9 for the input signal and the outputs PWM A and PWM B when the input signal reaches the zero crossover point from negative values.
Figure 15:
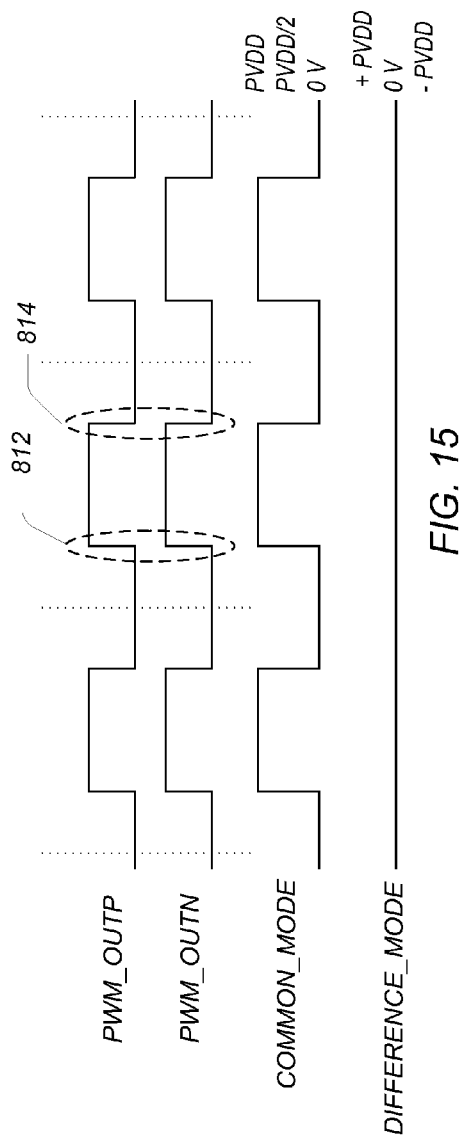
FIG. 15 shows a wave diagram illustrating the PWM signals during mute or periods of digital silence, for the embodiment of FIG. 61.

This power stage noise phenomena also occurs during periods of digital silence or mute, where the audio signal is at zero or near zero. FIG. 15 shows a wave diagram illustrating the PWM signals during mute or periods of digital silence, indicated by a zero difference mode signal. As seen in FIG. 15, the rising edges 812 of the PWM signals PWM_OUTP and PWM_OUTN are aligned with respect to each other, as are the falling edges 814, as shown. Delaying one PWM signal with respect to the other may eliminate this audio corruption issue. In some present day systems a delay element is added on one PWM output, thereby offsetting the PWM signals during zero crossings and periods of digital silence. FIG. 9 shows a modified version of the control diagram from FIG. 5, with a delay ΔT 902 added in the path of PWM B driver 510, to delay propagation of the PWM B signal to half-bridge B 514. The corresponding timing diagrams for the input source signal and PWM A and PWM B outputs are shown in FIGS. 10 and 11. FIG. 10 shows the waveforms for the input signal and the outputs PWM A and PWM B when the input signal reaches the zero crossover point from negative values. FIG. 11 shows the waveforms for the input signal and the outputs PWM A and PWM B when the input signal passes the zero crossover point and has a positive value. As seen in FIG. 10, rising edges 822 of the PWM A and PWM B signals no longer line up, and neither do the falling edges 824. Similarly, as seen in FIG. 11, rising edges 834 of the PWM A and PWM B signals no longer line up, and neither do the falling edges 834.

However, adding a DC-Offset to the input of the PWM signals may achieve the same result as delaying one PWM stream relative to the other. FIG. 12 shows a modified and expanded version of the control diagram from FIG. 5, highlighting how a DC-Offset may be added to both PWM signals to prevent the rising and falling edges of the PWM A and PWM B signals from lining up. In the embodiments shown in FIG. 12, an RMS (root mean square) detect block 904 also receives the signal from signal source 502, and uses the output generated by block 904 to generate an offset control signal in control block 906, which is used to generates a DC-Offset signal in block 908. The DC-Offset signal is then added to the respective inputs of PWM driver A 508 and PWM driver B 510. The corresponding timing diagrams for the input source signal and PWM A and PWM B outputs are shown in FIGS. 13 and 14. FIG. 13 shows waveforms corresponding to the control diagram of FIG. 12 for the input signal (marked SIGNAL) and the outputs PWM A (marked A) and PWM B (marked B), with the input signal having negative values and passing through the indicated DC offset active region between the indicated negative Audio Threshold and the zero crossover point. FIG. 14 shows the same waveforms as FIG. 13, but in this case the input signal has positive values as it passes through the indicated DC offset active region between the zero crossover point and the indicated positive Audio Threshold. As seen in FIG. 13, the respective rising edges of the PWM A and PWM B signals are pushed apart with respect to each other, as are the respective falling edges. Similarly, as seen in FIG. 14, the respective rising edges of the PWM A and PWM B signals are pushed apart with respect to each other, as are the respective falling edges.

Figure 16:
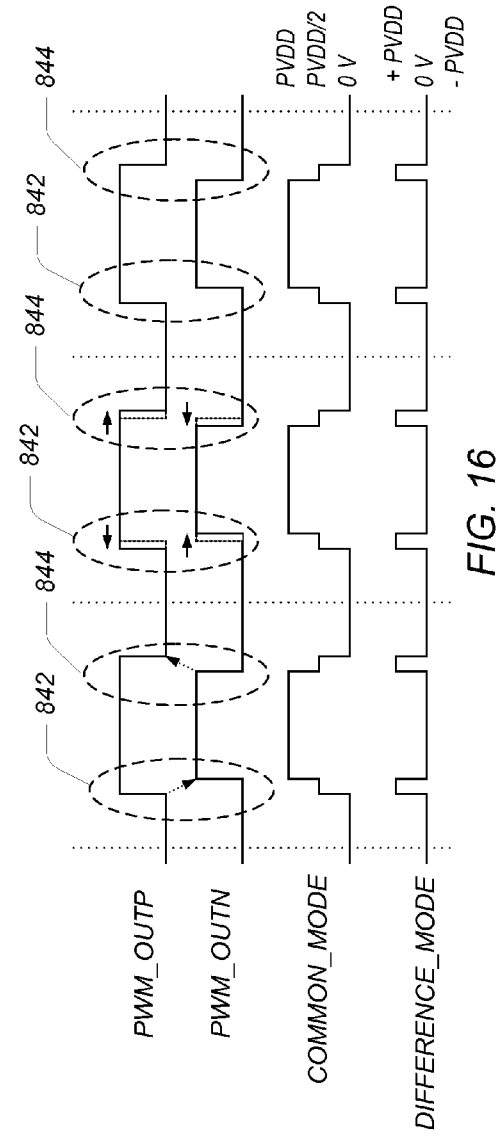
FIG. 16 shows a waveform diagram illustrating the addition of static DC-Offset to the PWM signals.
Figure 17:
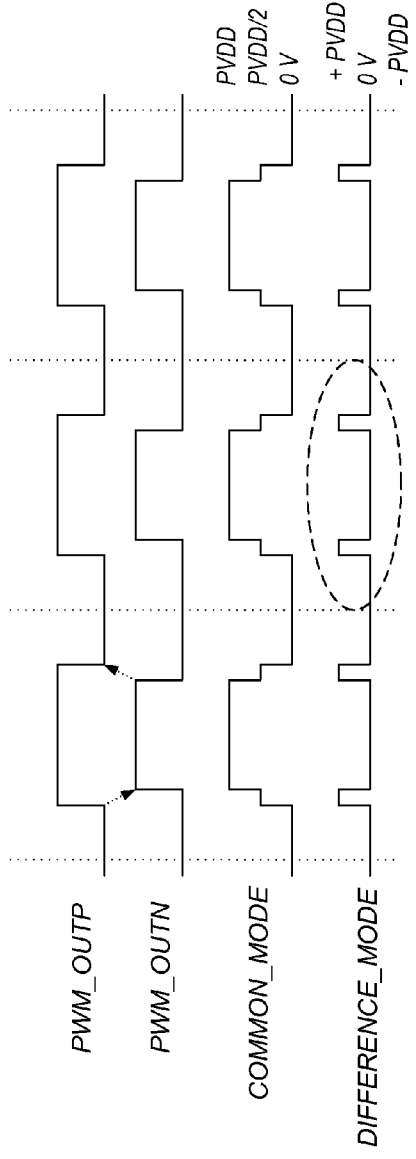
FIG. 17 shows a waveform diagram illustrating the DC residue at the load from the addition of static DC-Offset to the PWM signals, as it appears on the difference mode signal.

FIG. 16 shows a waveform diagram exemplifying the effects of adding a static DC-Offset to the PWM signals (referencing the signals output by a system such as the one exemplified in FIG. 7). As seen in FIG. 16, the rising edges 842 of PWM_OUTP and PWM_OUTPT no longer line up, and similarly, the falling edges 844 of PWM_OUTP and PWM_OUTPT are also no longer lining up with each other. However, this may introduce a DC-Offset in the difference mode (DM) signal, as illustrated FIG. 17, which shows a waveform diagram illustrating the effect that the addition of static DC-Offset to the PWM signals has on the difference mode signal. This static voltage level represents a DC-Offset at the load, and can harm, damage and even destroy the load, in this case, the speakers (e.g. speaker 124).

Figure 18:
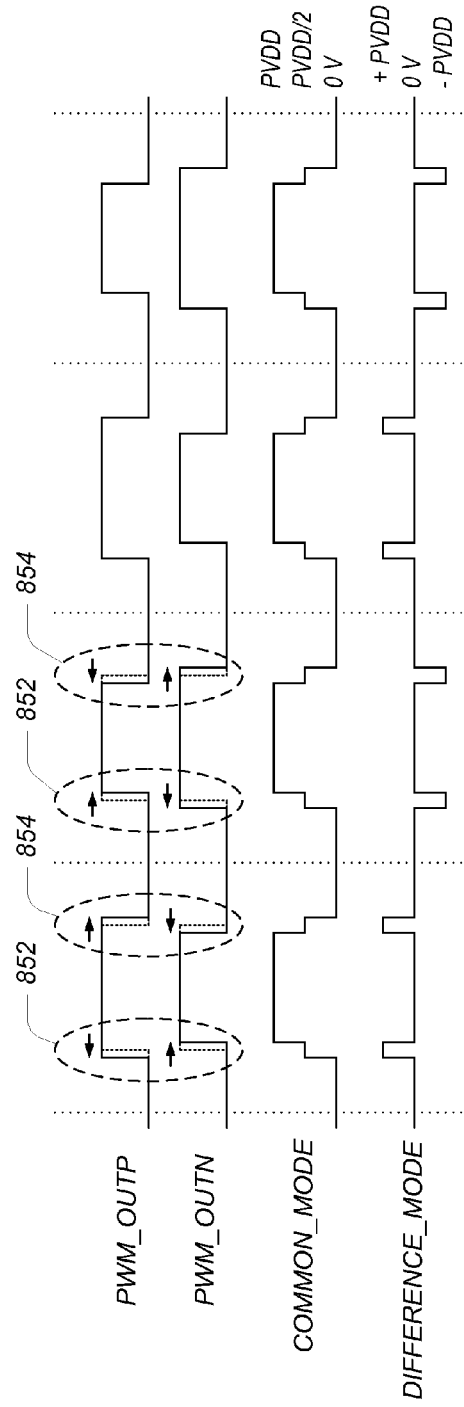
FIG. 18 shows a waveform diagram illustrating the addition of alternating positive and negative DC-Offsets to the PWM signals.

In one set of embodiments, a DC-Offset may be added and subtracted (or in other words, positive and negative DC-Offsets may be added) to move edges of the respective PWM signals apart. It should be noted that while only two PWM signals are shown for illustrative purposes, other embodiments may operate with three or more PWM signals, and the application of positive and negative DC-Offsets as set forth herein may equally be applied to more than two PWM signals to create a shift between the respective rising and falling edges of the different PWM signals. By alternating between positive and negative DC-Offsets at high frequency, the total DC content measured at the load, or speakers, remains at zero volts. The PWM output signals PWM_OUTP and PWM_OUTN resulting from the addition of an alternating and inverting DC-Offset are displayed in FIG. 18, which shows a waveform diagram illustrating the effects of the addition of alternating positive and negative DC-Offsets to the PWM signals. As seen in FIG. 18, the respective rising edges 852 of PWM_OUTP and PWM_OUTN are moved apart, as are the respective falling edges 854 of PWM_OUTP and PWM_OUTN.

Figure 19:
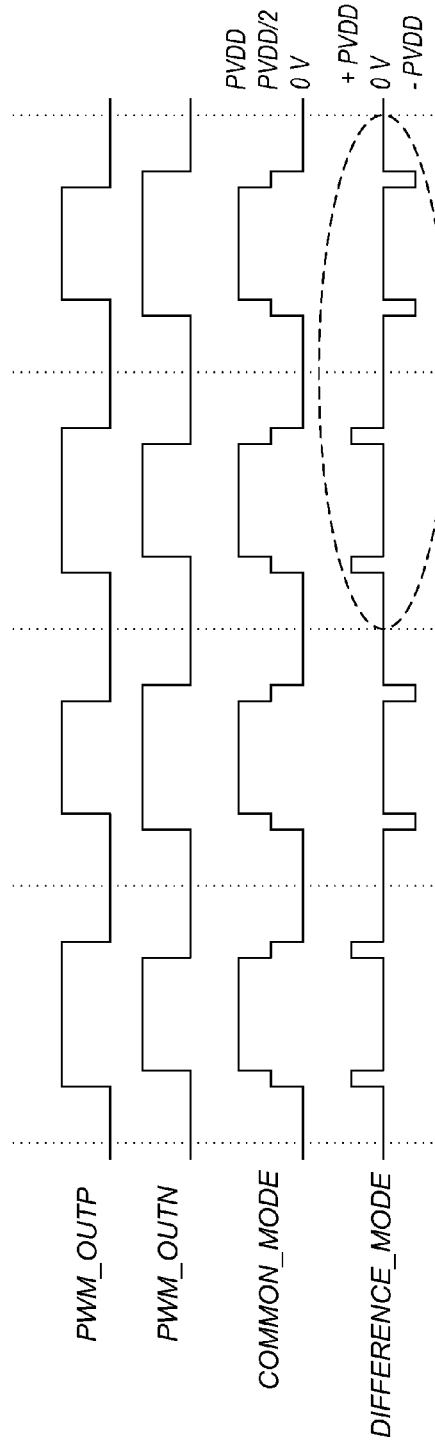
FIG. 19 shows a waveform diagram illustrating zero DC on the load as a result of the addition of alternating positive and negative DC-Offsets to the PWM signals.
Figure 20:
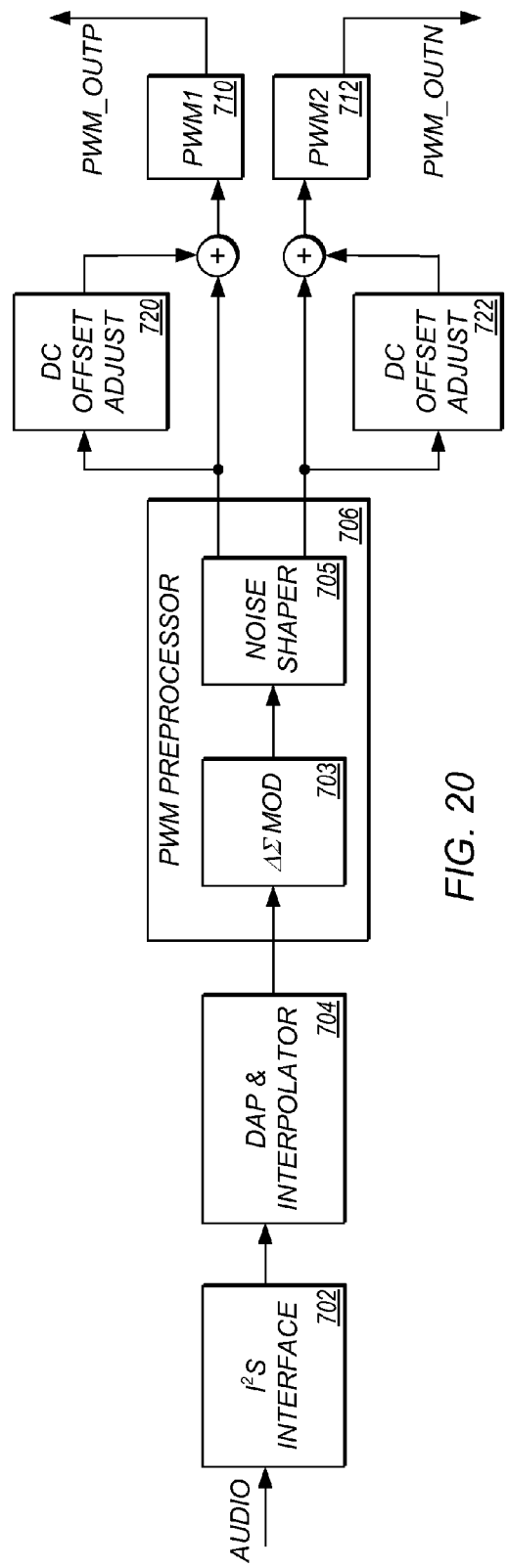
FIG. 20 shows one embodiment of a new audio subsystem with an added DC-Offset adjustment circuit.
Figure 22:
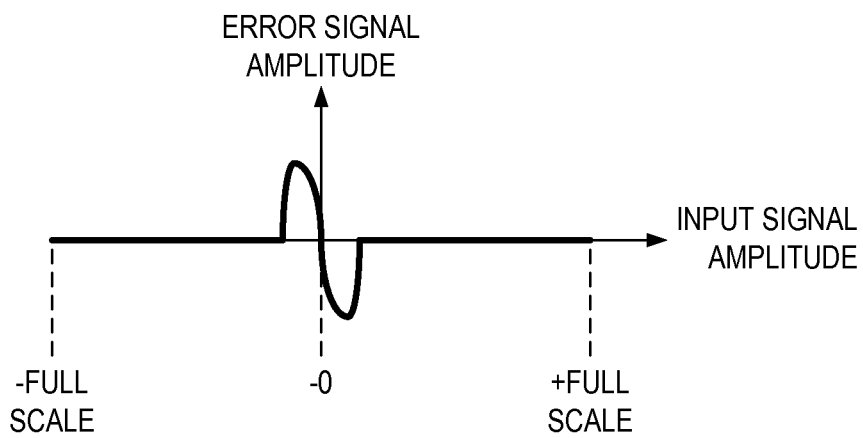
FIG. 22 shows the error signal amplitude without the addition of alternating positive and negative DC-Offsets to the inputs of the PWM drivers.
Figure 23:
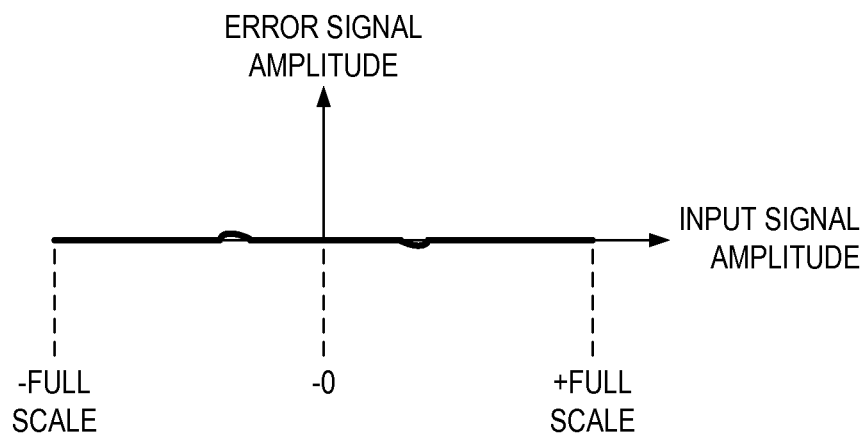
FIG. 23 shows the error signal amplitude when adding alternating positive and negative DC-Offsets to the inputs of the PWM drivers.

It can be shown that the cumulative DC component on the output is zero, since the alternating DC values cancel each other out. This is illustrated in FIGS. 22 and 23. As seen in FIG. 22, the error signal amplitude without the addition of alternating positive and negative DC-Offsets to the inputs of the PWM drivers is considerable. However, as seen in FIG. 23, the error signal amplitude is near zero when adding alternating positive and negative DC-Offsets to the inputs of the PWM drivers. FIG. 19 shows a waveform diagram illustrating the zero DC on the load as a result of the addition of alternating positive and negative DC-Offsets to the PWM signals. The partial system diagram of one embodiment of a new audio sub-system—based on the audio subsystem shown in FIG. 7—is shown in FIG. 20. In this embodiment, the respective inputs to PWM drivers 710 and 712 are first routed from PWM preprocessor 706 to offset adjust circuits 720 and 722, respectively. That is, a DC-Offset adjustment circuit is added to achieve the addition of positive and negative DC-Offsets as described above.

Figure 21:
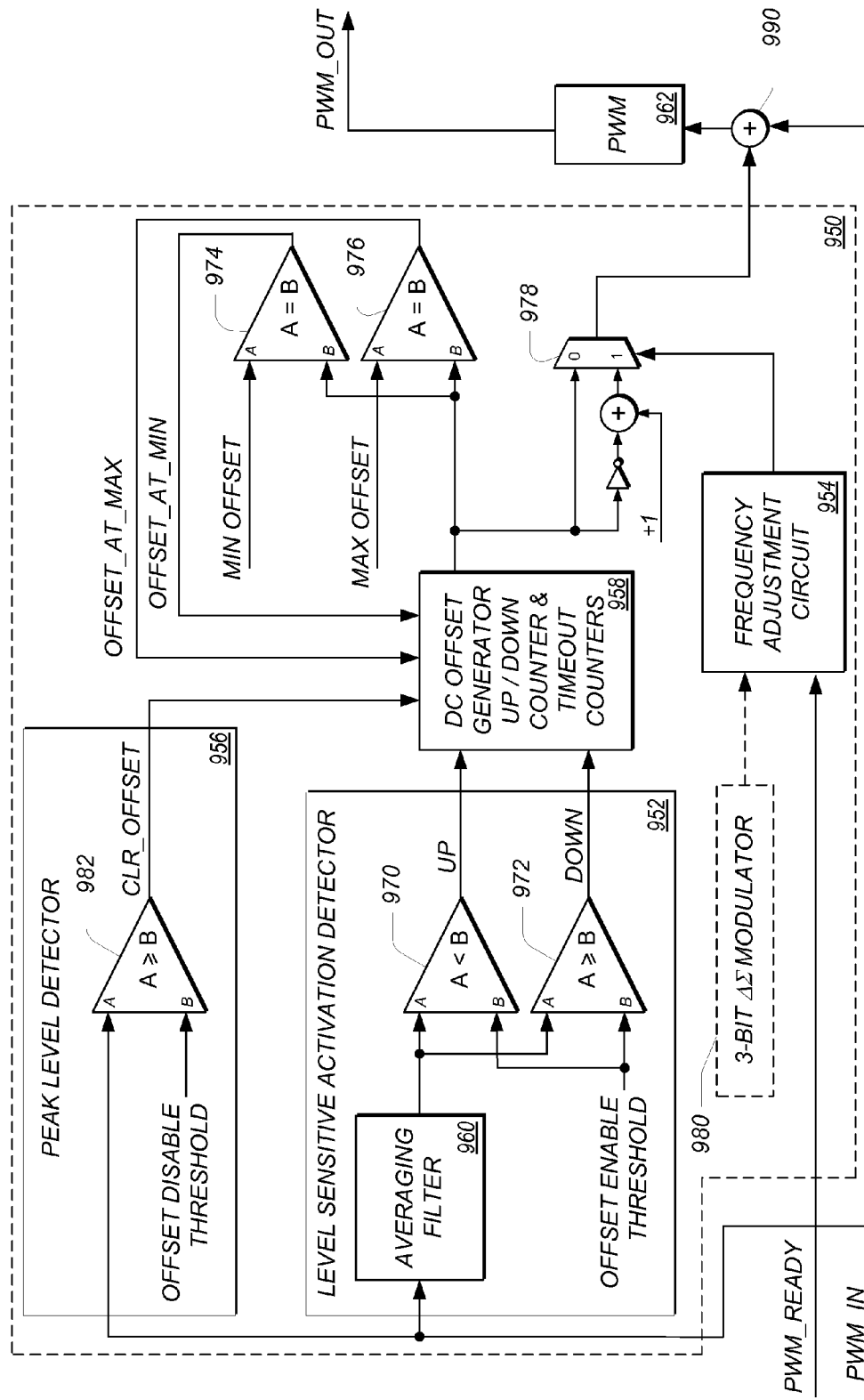
FIG. 21 shows a more detailed circuit diagram of one embodiment of the DC-Offset adjustment circuit of FIG. 20.

A more detailed circuit diagram of one embodiment of the DC-Offset adjustment circuits 720 and 722 is shown in FIG. 23. In the embodiment shown, a high frequency is used to alternate the addition and inversion of the DC-Offsets at a rate of $F_s/2$ (input sample rate). This is performed in part by frequency adjustment circuit 954, which may also provide the additional benefit of adding a zero in the quantization noise. The frequency of alternating and inverting the DC-Offsets at $F_s/2$ is well beyond the audio band, and does not affect the noise floor. In addition, a 3-bit Delta-Sigma Modulator 980 may be used to randomize the frequency with which the DC-Offsets are alternated and inverted, to obtain an effect very much similar to a spread spectrum. The circuit shown in FIG. 21 is representative of one embodiment of the DC-Offset adjustment circuit 720 and/or 722, and therefore shows the output for one PWM signal. Accordingly, PWM driver 962 is representative of one embodiment of PWM driver 710 and/or 712.

As shown in FIG. 21, a PWM input is provided to peak level detector 956 and level sensitive activation detector 952. A comparator 982 compares the instantaneous value of the PWM input signal against an offset disable threshold, and if the value of the PWM signal is greater than or equal than the value of the offset disable threshold, the offset value is cleared in the DC-Offset generator 958. An averaging filter 960 within activation detector 952 is used to provide an absolute value of the PWM signal, which is then compared with an offset enable threshold value in comparators 970 and 972. If the absolute value of the PWM input signal is less than the offset enable threshold value (illustrated as the respective negative and positive audio threshold values in FIG. 13 and FIG. 14, respectively), DC-Offset generator 958 may be instructed to engage the timeout counters (up/down counter) to ramp up the DC-offset from the minimum DC-offset to the maximum DC-offset over a programmable number of steps with a programmable time constant for each step. If, on the other hand, the absolute value of the PWM input signal is greater than or equal than the offset enable threshold value, DC-Offset generator 958 may be instructed to engage the timeout counters (up/down counter) to ramp down the DC-offset from the minimum DC-offset to the maximum DC-offset over a programmable number of steps with a programmable time constant for each step. The offset value output by DC-Offset generator 958 is compared against a specified minimum offset value in comparator 974 and against a specified maximum offset value in comparator 976. When the offset value reaches the specified maximum or the specified minimum, DC-Offset generator 958 is instructed to hold the output value at the present DC-Offset. Frequency adjustment circuit 954 is used to select which input of multiplexer 978 is provided to summing node 990 to generate the input to PWM driver 962.

The embodiment of the DC-Offset adjustment circuit shown in FIG. 21 may operate to circumvent clipping in the PWM circuits by using the level sensitive activation detector circuit 952 that compares the absolute value of the input to a programmable threshold. Input values that are greater than the threshold may decrease the DC-Offset until the offset is eliminated, and conversely, if the input signal is less than the threshold, the DC-Offset may increase until it reaches a programmable maximum. As mentioned above, the input to level sensitive activation detector may be calculated as an RMS value of the input audio signal, or through an averaging filter 960 having a fast attack and slow release response. The ability to quickly enter into this algorithm may be used to improve the noise performance by alternating the DC-Offset at low signal levels. Additionally, the averaging filter 960 may eliminate dithering on audio input that is near to the offset enable threshold. The filter's slow increase and decrease of the DC-Offset over time, as well as the number of steps and the time constant per step in the timeout counters in DC-Offset generator 958 reduces the possibility of pops and clicks.

A peak detection of the input audio may be used to exit the algorithm and avoid clipping in the PWM, if large input signals—greater than the offset disable threshold—are detected. Due to the inherent slew through the audio subsystem illustrated in earlier figures, a zero to full-scale data change at the input to the PWM may occur in multiple PWM periods, and this latency may further prevent clipping, since the peak detector threshold may be comfortably set below the clipping levels.

Although the embodiments above have been described in considerable detail, numerous variations and modifications will become apparent to those skilled in the art once the above disclosure is fully appreciated. It is intended that the following claims be interpreted to embrace all such variations and modifications.

We claim:

1. A method of attenuating non-linear noise in an open-loop amplifier, the method comprising:
    deriving a first representative signal and a second representative signal from a source signal;
    obtaining a first intermediate signal by deriving a positive DC-offset from the source signal, and adding the positive DC-offset to the first representative signal;
    obtaining a second intermediate signal by deriving a negative DC-offset from the source signal, and adding the negative DC-offset to the second representative signal, wherein the negative DC-offset and the positive DC-offset have a same absolute value;
    deriving a first control signal from the first intermediate signal, and a second control signal from the second intermediate signal; and
    obtaining an amplified version of the source signal by controlling a first set of switches with the first control signal, and a second set of switches with the second control signal;
    the method further comprising alternating between:
        adding the positive DC-offset to the first representative signal while adding the negative DC-offset to the second representative signal; and
        adding the positive DC-offset to the second representative signal while adding the negative DC-offset to the first representative signal.

2. The method of claim 1, wherein said alternating is performed at a frequency that is beyond a baseband of the source signal.

3. The method of claim 1, wherein the first control signal and the second control signal are pulse-width modulated (PWM) signals.

4. The method of claim 1, wherein the first set of switches and the second set of switches comprise complementary metal-oxide semiconductor (CMOS) devices.

5. The method of claim 1, wherein said deriving the positive DC-offset and said deriving the negative DC-offset comprises determining a value of the source signal.

6. The method of claim 5, wherein said determining comprises performing root mean square level comparison.

7. The method of claim 1, further comprising:
    adjusting the absolute value of the negative and positive DC-offset over a time period of specified length to ensure that no noise is introduced in the amplified version of the source signal.

8. The method of claim 7, wherein said adjusting the absolute value of the negative and positive DC-offset comprises:
    increasing the absolute value of the negative and positive DC-offset when a value of the source signal is small; and
    decreasing the absolute value of the negative and positive DC-offset when a value of the source signal is large;
    wherein a small value of the source signal corresponds to the amplified version of the source signal falling below a specified value, and a large value of the source signal corresponds to the amplified version of the source signal reaching or exceeding the specified value.

9. The method of claim 8, wherein the source signal is an audio signal;
    wherein the amplified version of the source signal falling below a specified value means that the amplified version of the source signal is inaudible; and
    wherein the amplified version of the source signal reaching or exceeding the specified value means that the amplified version of the source signal is audible.

10. The method of claim 7, wherein the specified length is programmable.

11. The method of claim 7, further comprising terminating said adjusting the absolute value of the negative and positive DC-offset when the absolute value of the negative and positive DC-offset reaches one of:
    a maximum value; or
    a minimum value.

12. An amplifier comprising:
    an input interface configured to receive a source signal;
    a first set of control switches and a second set of control switches configured to produce an amplified version of the source signal;
    a preprocessor configured to generate a first representative signal and a second representative signal based on the source signal;
    offset circuitry configured to:
        generate a DC-offset value based on the source signal;
        produce a first control input signal from the DC-offset value and the first representative signal; and
        produce a second control input signal from the DC-offset value and the second representative signal;
    wherein the offset circuitry is configured to alternate between:
        (a) adding the DC-offset value to the first representative signal to produce the first control input signal while subtracting the DC-offset value from the second representative signal to produce the second control signal; and
        (b) subtracting the DC-offset value from the first representative signal to produce the first control input signal while adding the DC-offset value to the second representative signal to produce the second control signal;
    driver circuitry configured to:
        generate a first driver signal based on the first control input signal;

generate a second driver signal based on the second control input signal; and control the first set of control switches with the first driver signal, and control the second set of switches with the second driver signal, to generate the amplified version of the source signal.

13. The amplifier of claim 12, wherein the driver circuitry comprises pulse-width modulation circuitry; and wherein the first driver signal and the second driver signal are pulse-width modulated signals.

14. The amplifier of claim 12, wherein the input interface comprises an I²S interface.

15. The amplifier of claim 12, wherein the preprocessor comprises:

a delta-sigma modulator configured to convert the source signal; and a noise shaper configured to generate the first representative signal and the second representative signal from the converted source signal.

16. The amplifier of claim 12, wherein the offset circuitry comprises frequency adjustment circuitry configured to control a frequency at which the offset circuit alternates between (a) and (b).

17. The amplifier of claim 16, wherein the frequency is beyond a baseband of the source signal.

18. The amplifier of claim 16, wherein the offset circuitry further comprises a delta-sigma modulator configured to randomize the frequency.

19. The amplifier of claim 12, wherein the offset circuitry is further configured to:

increase the DC-offset value over a time period of specified length when a value of the source signal is less than a specified threshold value; and decrease the DC-offset value over a time period of specified length when a value of the source signal is greater than or equal to the specified threshold value.

20. The amplifier of claim 19, wherein the offset circuitry is further configured to:

cease increasing the DC-offset value when it reaches a specified maximum value; and cease decreasing the DC-offset value when it reaches a specified minimum value.

21. The amplifier of claim 20, wherein the offset circuitry is further configured to receive the specified threshold value, the specified maximum value, and the specified minimum value as input values.

22. An amplifier comprising:

a first processing element configured to derive a first representative signal and a second representative signal from a source signal;

a second processing element configured to:

derive a DC-offset value from the source signal;

obtain a first intermediate signal from the first representative signal by adjusting the first representative signal by the DC-offset value;

obtain a second intermediate signal from the second representative signal by adjusting the second representative signal by the DC-offset value; and a third processing element configured to:

derive a first control signal from the first intermediate signal, and a second control signal from the second intermediate signal; and create an amplified version of the source signal by controlling a first set of switches with the first control signal, and a second set of switches with the second control signal;

wherein the second processing element is further configured to:

obtain the first intermediate signal by alternately adding and subtracting the DC-offset value to/from the first representative signal; and obtain the second intermediate signal by alternately:

adding the DC-offset value to the second representative signal when subtracting the DC-offset value from the first representative signal; and subtracting the DC-offset from the second representative signal when adding the DC-offset value to the first representative signal.

23. The amplifier of claim 22, further comprising the first set of switches and the second set of switches.

24. The amplifier of claim 22, wherein the third processing circuit is a pulse-width modulator, and the first control signal and the second control signal are pulse-width modulated signals.

25. The amplifier of claim 22, wherein the second processing element comprises an adjustment circuit configured to control a frequency with which the second processing element alternates between adding and subtracting the DC-offset value to/from the first representative signal and the second representative signal.

26. The amplifier of claim 25, wherein the frequency is outside a baseband frequency bandwidth of the source signal.

27. The amplifier of claim 25, wherein the second processing element further comprises modulation circuitry configured to randomize the first frequency.

28. The amplifier of claim 25, wherein the second processing element is further configured to adjust the DC-offset value according to a value of the source signal.

29. The amplifier of claim 28, wherein in adjusting the DC-offset value, the second processing element is configured to increase the DC-offset value when the value of the source signal exceeds a programmable enable threshold value, until the DC-offset value reaches a programmable maximum offset value.

30. The amplifier of claim 28, wherein in adjusting the DC-offset value, the second processing element is configured to decrease the DC-offset value when the value of the source signal does not exceed a programmable enable threshold value, until the DC-offset value reaches a programmable minimum offset value.

31. The amplifier of claim 28, wherein in adjusting the DC-offset value, the second processing element is configured to clear the DC-offset value when the value of the source signal either reaches or exceeds a programmable offset disable threshold value.

* * * * *